United States Patent [19]

Marschall

[11] Patent Number: 5,119,096

[45] Date of Patent: Jun. 2, 1992

[54] ANALOG TO FREQUENCY CONVERTER WITH BALANCING COMPENSATION CYCLES

[76] Inventor: Klaus Marschall, Dornerweg 1, D-7758 Meersburg, Fed. Rep. of Germany

[21] Appl. No.: 566,558

[22] Filed: Aug. 13, 1990

[30] Foreign Application Priority Data

Aug. 11, 1989 [DE] Fed. Rep. of Germany ....... 3926599

[51] Int. Cl.$^5$ ............................................. H03M 1/60
[52] U.S. Cl. ..................................... 341/157; 341/119
[58] Field of Search ............... 341/157, 158, 164, 166, 341/118, 119, 155, 157

[56] References Cited

U.S. PATENT DOCUMENTS

| | | | |
|---|---|---|---|
| 4,083,044 | 4/1978 | Marshall III et al. | 341/157 |
| 4,357,599 | 11/1982 | Takahashi | 341/157 |
| 4,380,757 | 4/1983 | Vancsa | 341/157 X |
| 4,435,697 | 3/1984 | Takahashi | 341/157 |
| 4,672,331 | 6/1987 | Cushing | 341/157 |
| 4,754,257 | 6/1988 | Takahashi | 341/157 |
| 4,942,401 | 7/1990 | Gessaman et al. | 341/157 |
| 4,965,578 | 10/1990 | Poujois | 341/157 X |

FOREIGN PATENT DOCUMENTS

| | | |
|---|---|---|
| 2048038 | 4/1972 | Fed. Rep. of Germany . |
| 3029932 | 2/1981 | Fed. Rep. of Germany . |
| 3037174 | 4/1981 | Fed. Rep. of Germany . |
| 207992 | 3/1984 | Fed. Rep. of Germany . |
| 3326204 | 1/1985 | Fed. Rep. of Germany . |
| 3545375 | 6/1987 | Fed. Rep. of Germany . |
| 3617936 | 12/1987 | Fed. Rep. of Germany . |

OTHER PUBLICATIONS

"IEEE Transactions on Instrumentation and Measurements", Vo. IM-24, No. 3 (1975), 255-261.
Prazisions-A-D-Umsetzer mit interner Selbsteichung, Berlin 32 (1983) 220-226.
Spannungs-Frequenzwandler, radio fernsehen elektronik 29 (1980) H4, 257-260.

Primary Examiner—Howard L. Williams
Attorney, Agent, or Firm—Lee, Mann, Smith, McWilliams, Sweeney & Ohlson

[57] ABSTRACT

An integrated circuit component is provided for the analog signal-to-frequency conversion independent of temperature variations. The integrated circuit component contains circuits for generating known analog balancing currents in the form of impressed, load-independent currents. The analog input signal is converted into a load-independent current and in sequence with the balancing signals applied to a current controlled oscillator. The frequencies obtained therefrom are converted into digital values by a frequency-to-digital converter. A microprocessor computes the digital value corresponding to the input signal.

7 Claims, 4 Drawing Sheets

ANALOG TO FREQUENCY CONVERTER WITH BALANCING COMPENSATION CYCLES

TECHNICAL FIELD

The invention relates to a circuit arrangement for the analog signal-to-frequency conversion having an input for an analog input signal and converter means for converting analog signals into frequencies using an analog-to-frequency converter means and a processor.

Measuring signals, as a rule, are provided by sensors as analog signals. For the processing of such a signal in a digital computer with processor, the signal has to be converted into a digital word.

Often the sensor is remote from the computer. Therefore, the signal has to be transmitted to the computer. Accurate signal transmission with analog signals is very difficult. Therefore the signal is converted into a frequency by means of an analog signal-to-frequency converter. This frequency can be transmitted to the computer substantially without interference. In the computer, a digital word is formed out of the frequency, for example by counting the pulses during a predetermined time. This type of transmission offers the advantage, that the frequency is not disturbed by the attenuation of a transmission cable or similar influences.

BACKGROUND ART

Voltage-to-frequency converters in the form of integrated circuit components are known, which require input voltages in the order of volts. The conversion is effected with an accuracy of approximately 0.8 percent of the end value over the range of operating temperatures. This accuracy is achieved only, if each individual converter component of each computer or sensor, respectively, is manually adjusted with respect to offset of characteristic and gain. The accuracy of the conversion is heavily affected by variations of the ambient temperature due to the influence thereof on the characterizing parameters of the components.

Often, however, sensors provide signals in the range of millivolts. In order to permit processing of such signals with a commercially available voltage-to-frequency converter, the signals have to be pre-amplified. Such pre-amplification is effected by means of an operational amplifier. This operational amplifier, however, introduces errors of the signal to be converted due to offset of characteristic, gain variations and its dependence on temperature.

DISCLOSURE OF THE INVENTION

It is the object of the invention to provide an analog signal-to-frequency converter as a unit which in combination with a processor and as the interface component thereof permits direct and highly accurate conversion of sensitive sensor signals into a frequency, and the conversion accuracy of which is virtually unaffected by offset, gain and effect of temperature, and which, in use, does not require individual adjustment of the circuit.

According to the invention this object is achieved in that (a) the circuit arrangement comprises means (38, 44, 48, 50, 54) for generating known, analog balancing signals, and (b) means are provided for converting by said converter means (66), in predetermined sequence, the analog input signal to be converted applied to the input (10, 12), and the balancing signals into associated frequencies, (c) said processor (89) being arranged to compute a digital value of the analog input signal from the two digital values which are obtained from the frequencies generated by converting said balancing signals and from the digital value which is generated by converting said analog input signal.

Thus, in accordance with the invention, known balancing signals are generated with the analog signal-to frequency converter. From these balancing signals the processor determines a characteristic of voltage versus frequency with two calibration points. These calibration points are determined by the digital values which are assigned to the two balancing signals, by means of the associated frequencies generated with the balancing signals. In accordance with this characteristic, a certain digital value results for the input signal. This digital value is independent of whether by temperature changes, for example, the characteristic of the analog signal-to-frequency converter has been changed and thus the frequencies associated with the input signal and the balancing signals. Therefore, though the information is represented by a frequency, this frequency alone does not provide the exact digital value of the signal to be measured. With identical input signals, the frequency may be different with different environmental conditions.

The input signal may be a measuring voltage. Preferably the circuit contains means for converting this measuring voltage into a measuring current. The balancing signals are load-independent currents. These currents are applied to a summing point. The summing point is connected to a current controlled oscillator, which provides the output frequencies.

It has been found, that these analog input signals in the range of millivolt can be used directly, i.e. without pre-amplification, for the control of the oscillator.

Preferably, a reference voltage generates, through a first resistor, an upper and a lower balancing current. As a reference signal, a reference current is generated through a second resistor. In a first conversion under the control of the processor, the measuring current and the reference current are applied to the summing point. In a second conversion, both the upper balancing current and the reference current are applied to the summing point. In a third conversion, the lower balancing current and the reference current are applied to the summing point.

This permits the signal processing in the processor to determine the digital value associated to the input voltage in a way independent of temperature.

An embodiment of the invention is described in greater detail hereinbelow with reference to the accompanying drawings.

PREFERRED EMBODIMENT OF THE INVENTION

Figure 1:
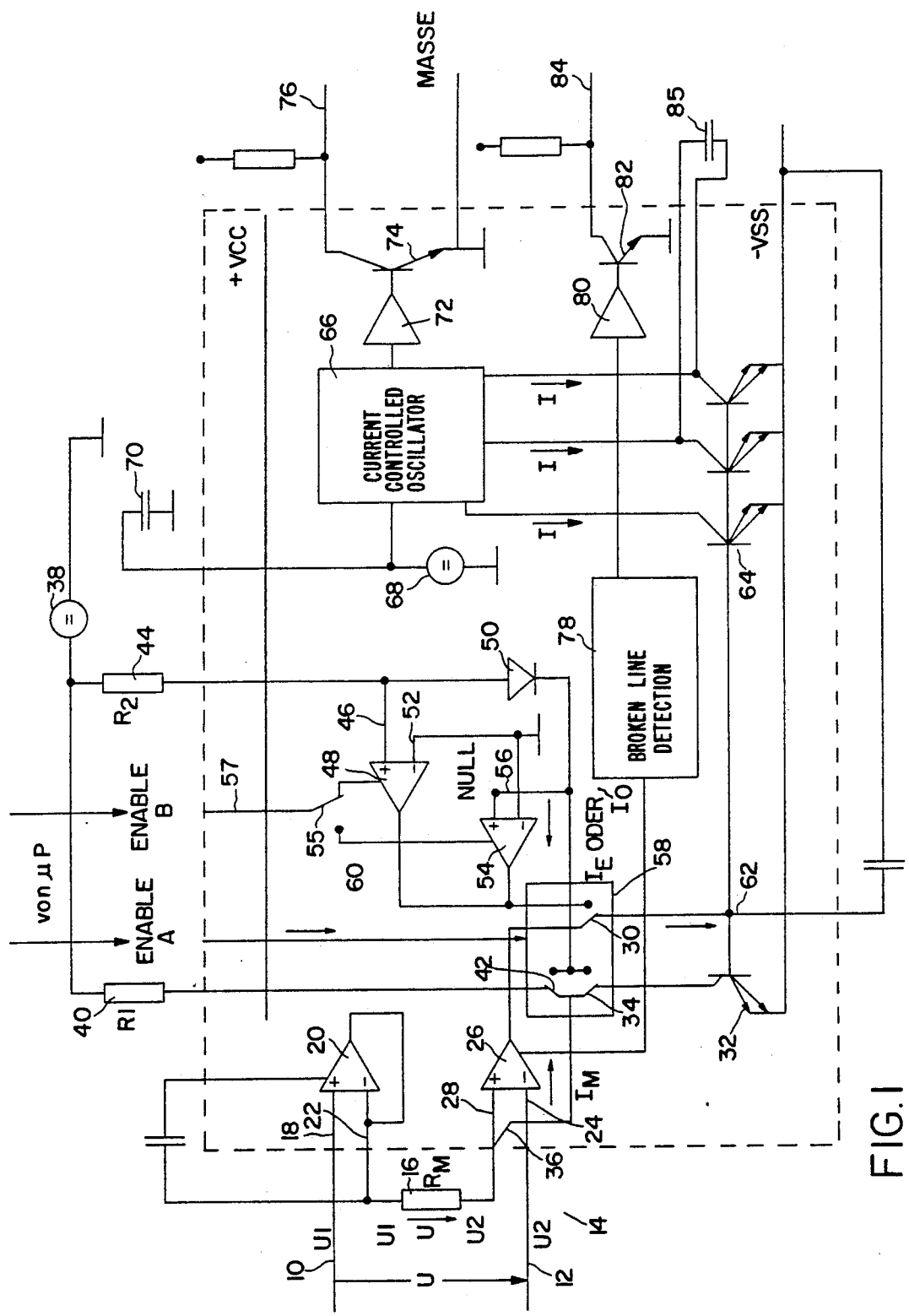
FIG. 1 is a schematic wiring diagram of the converter circuit.

In the embodiment of FIG. 1, the analog input signal is a measuring voltage U applied to input terminals 10 and 12. The converter comprises means 14 for converting this measuring voltage U into a current $I_M$ proportional thereto. These means comprise a measuring resistor 16 with a resistance $R_M$. An input 18 of an operational amplifier 20 is connected to the first terminal 10 of the measuring voltage U. The second input of the operational amplifier 20 is connected with a first end of the measuring resistor 16. Also the output of the operational amplifier 20 is connected with this input 22 and with the end of the measuring resistor 16. Then the operational amplifier 20 provides such a current, which flows through resistor 16 so that the potential at the end of the measuring resistor 16 is always maintained at the potential of the input terminal 10.

The second input terminal 12 of the measuring Voltage U is connected with an input 24 of an operational amplifier 26. The other input 28 of the operational amplifier 26 is connected with the second end of the measuring resistor 16. The output of the operational amplifier 26 is connected to the base of a transistor 32 through an electronic switch 30. The transistor 32 is connected with the second end of the resistor 16 through an electronic switch 34 and a conductor 36. The transistor 32 is controlled in such a way that the voltage between the inputs 24 and 18 and, thereby, the potential difference between the second (lower) end of the measuring resistor 16 and the second input terminal 12 becomes zero. Then an impressed current, i.e. a load-independent, current $I_M$ proportional to the input voltage U flows through the measuring resistor 16. Variations of the voltages on the input terminals 10 and 12 in the same sense do not affect the converter. This current $I_M$ flows through conductor 36, switch 34 and transistor 32.

Numeral 38 designates a reference voltage source. The reference voltage source 38 generates a reference voltage $U_{REF}$ against earth. A circuit is closed from the reference voltage source 38 through a resistor 40 having a resistance $R_1$, a switch 42, the switch 34 connected in series therewith, and Transistor 32. The current flowing in this circuit is called reference current.

A second circuit is closed from the reference voltage source 38 through a resistor 44 having a resistance $R_2$, to an input 46 of an operational amplifier 48, on one hand, and through a diode 50 to the second "contacts" of the "switches" 34 and 42 designed as double-pole switches, on the other hand. The switches are, of course, electronic switches, which have been illustrated as mechanical contacts for clarity. If "contacts" are mentioned herein, this means the corresponding terminals of the electronic switches.

The second input 52 of the operational amplifier 48 is connected to earth. The output of the operational amplifier 48 is connected to the second "contact" of the switch 30, which is also a double-pole switch. Through this switch 30, the output of the operational amplifier can be connected to the base of transistor 32 in the point 62. The operational amplifier provides a load-independent current $I_E$, which is called "upper balancing current".

A further operational amplifier is designated by numeral 54. A first input 56 of the operational amplifier 54 is on zero potential through diode 50 and the second contacts of the switches 34 and 42. The second operational amplifier 54 provides a current which is called "lower balancing current". The second input of the operational amplifier 54 like the second input of the operational amplifier 48 is connected to earth.

Through a double-pole switch 55 either the operational amplifier 48 or the operational amplifier 54 can be energized depending on a signal from the processor through a control conductor 57. Similarly, the switches 30, 34 and 42 can be switched into their respective other positions by a signal from the processor. This is illustrated by the box 58 surrounding the switches and by a control conductor 60.

Through switch 30 in the two switch positions thereof, either the output from the operational amplifier 26 or the outputs from the operational amplifiers 48 and 54 can be connected to the junction 62, which is connected with the base of the transistor 32.

Through the switches 34 and 42, the collector of the transistor 32 is connected either to the resistor 16 and current $I_M$ and the resistor 40 and current $I_1$ or simultaneously to the resistor 40 and the resistor 44.

Parallel to the transistor 32, to the base of which the output voltage of the operational amplifier 26 or the output volage of one of the operational amplifiers 48 or 54 is applied in junction 62, the transistors 64 are triggered. The transistors 64 draw current from a current controlled oscillator 66. The current controlled oscillator 66 is connected to a reference voltage source 68, which is stabilized by a capacitor 70. A capacitor 85 is connected in parallel to two of the transistors 64. This capacitor 85 is connected to the oscillator as outside component and serves to determine the frequency range thereof. The current controlled oscillator 66 controls an output transistor 74 through an amplifier 72. The output transistor provides pulse sequences with the output frequency on an output conductor 76. The output conductor 76 is connected, through a frequency-to-digital converter 87 (FIG. 6) with a processor 89.

Instead on a sensor remote from the processor, the analog signal-to-frequency vonverter may also be arranged within the computer. In this case, the advantage of low-interference transmission is no longer utilized but the fact that the analog signal-to-frequency conversion is effected independently of the ambient temperature.

Numeral 78 designates a circuit for detecting wire breakage. The circuit 78 provides a signal which is applied through an amplifier 80 and an output transistor to an output conductor 84 also connected with the processor.

The operation of the described circuit will be explained in greater detail hereinbelow with reference to FIG. 2, which illustrates in a block diagram the summation of the various load-independent currents.

The potentials $U_1$ and $U_2$ are applied to the input terminals 10 and 12. The difference of these potentials, the measuring voltage $$U = U_1 - U_2$$

is imaged across the measuring resistor 16 with the resistance $R_M$, which is connected to the circuit at the outside, as described. The measuring voltage U is converted into a load-independent current proportional to U. This is effected by a U/I-converter, which is designated by numeral 86 in FIG. 2. The U/I-converter provides a measuring current $$I_M=(U_1-U_2)/R_M.$$

A reference current $I_1$ is generated by the reference voltage $U_{REF}$ of the reference voltage source 34, which is connected across the resistor 40 having the resistance $R_1$. A U/I-converter 88 takes care of this current being an impressed, i.e. load-independent, current. This reference current $$I_1=U_{REF}/R_1$$

is applied to a summing point 90. Also in FIG. 2, the measuring current $I_M$ is applied to the summing point 90 through a switch 34. The reference current $I_1$ is always applied through switch 42. Therefore, switch 42 is not illustrated in FIG. 2. In the illustrated positions of the switches 34 and 42 in FIG. 1 and of the switch 34 in FIG. 2, a current $$I=I_1+I_M$$

is generated at the summing point 90. This current is supplied to the current controlled oscillator 66. The oscillator provides an output frequency associated with the measuring signal of $$F_M=(U_{REF}/R_1+U/R_M)/(4CU_R).$$

C being the capacity of capacitor 85, and $U_R$ being the reference voltage from the reference voltage source 68. The frequency $F_M$ is supplied to a frequency-to-digital converter 87 (FIG. 6), from which the processor receives the digital value of $F_M$. Then the processor generates a signal at the control conductor 60. Thereby, the switches 30, 34 and 42 of the circuit arrangement 58 are reversed.

Figure 2:
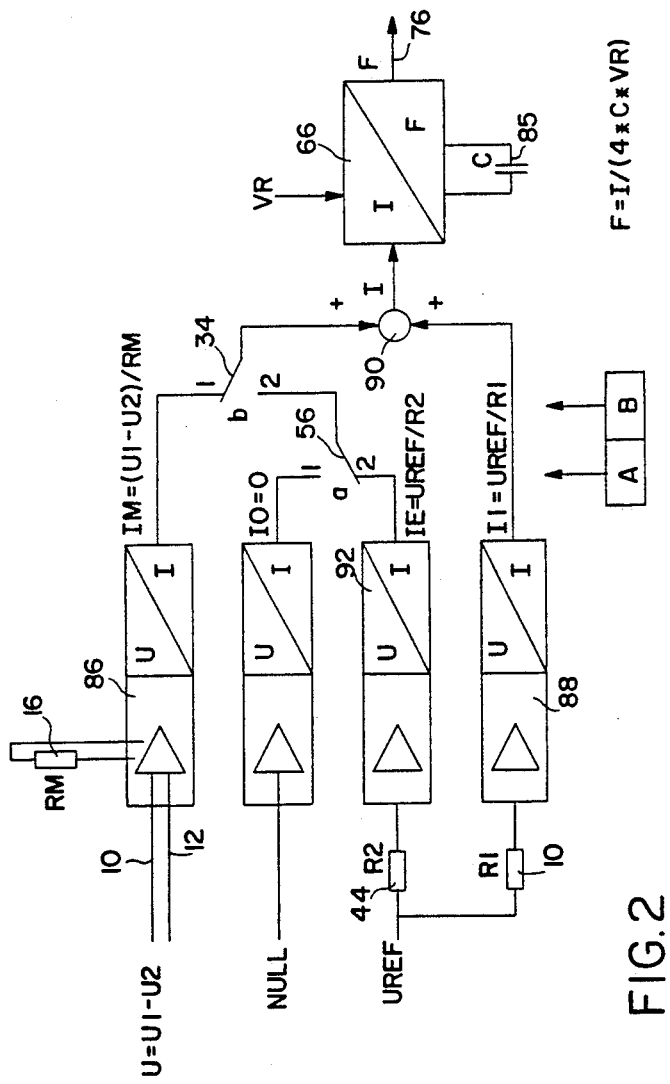
FIG. 2 illustrates schematically the superposition of the currents for the control of the current controlled oscillator in the converter circuit of FIG. 1.

In FIG. 2, the reference voltage $U_{REF}$ is also connected to a resistor 44 (corresponding to resistor 44 of FIG. 1). A current $$I_E=U_{REF}/R_2$$

is obtained. A U/I-converter 92 takes care of this current being a load-independent, impressed upper balancing current. After the reversal of the switch 34 in FIG. 2, a summation current $$I=I_1+I_E$$

is obtained at summing point 90. This summation current controls the current controlled oscillator 66. Correspondingly, this oscillator provides an output frequency $$F_E=U_{REF}(1/R_1+1/R_2)/(4CU_R)$$

corresponding to the upper end of the measuring range. Subsequently the frequency conversion at the zero point of the measuring range is effected. To this end switch 56 is switched over under the control of the processor by a signal on control conductor 57. Thereby the operational amplifier 48 is switched off and the operational amplifier 54 is switched on. Now the currents $I_1$ and $I_0$ are superposed in the summing point 90, wherein $I_0=0$, when the input signal zero is assigned to the zero point of the measuring range. The summation current $$I=I_1+I_0$$

is supplied to the current controlled oscillator 66. The oscillator provides an output frequency for the zero point of the measuring range of $$F_0=U_{REF}/(R_1.4CU_R).$$

Also this output frequency is transmitted to the processor through conductor 76 and the frequency-to-digital converter 87.

Now the processor is arranged such that it forms a digital value representing the measuring voltage U from the three received and stored digital values representing the three frequencies in accordance with the relation:

$$U_M=(U_{REF}*R_M/R_2)+(F_M-F_0)/F_E-F_0).$$

In this relation, $U_M$ is the digital value which is associated with the analog input voltage U. It will be notives that in this expression the first bracket is a constant, for which the nominal values of $U_{REF}$ and the resistances of the resistors 16 and 44 are substituted, while the further expression is variable and is a function of the measured frequencies.

The circuit which is arranged in the dashed bordering in FIG. 1 is constructed as an integrated circuit component.

Figure 3:
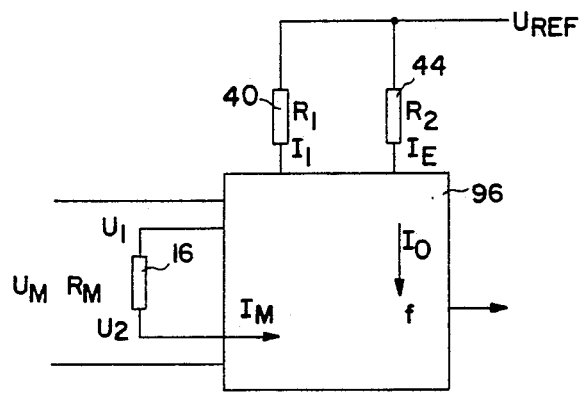
FIG. 3 shows the wiring of the converter circuit formed by a monolithic integrated circuit for the case, where the analog input quantity to be converted is an electrical resistance.
Figure 6:
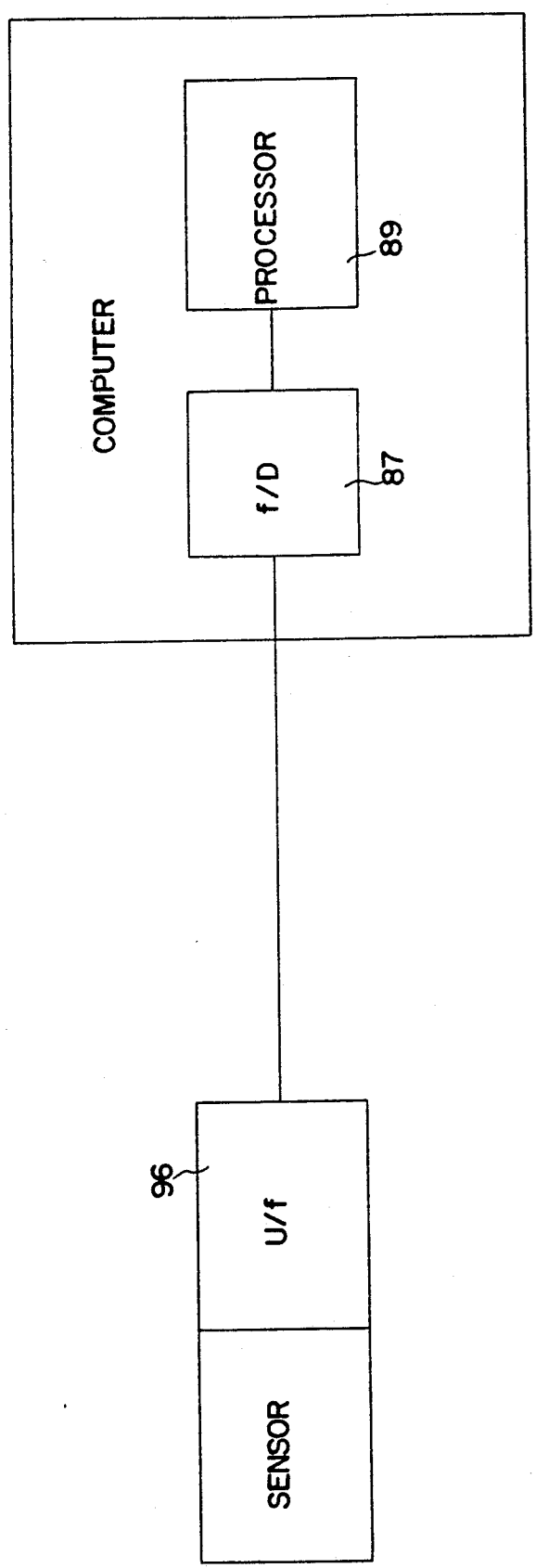
FIG. 6 shows the arrangement of the converter circuit in combination with a sensor, a frequency-to-digital converter and a processor.

In FIG. 3 and FIG. 6 this integrated circuit component is designated by numeral 96. At the outside, this integrated circuit component is wired with an appropriate measuring resistor 16 and the resistors 40 and 44, by which the measuring range can be fixed. Also the reference voltage is applied from the outside and can be selected appropriately.

Figure 4:
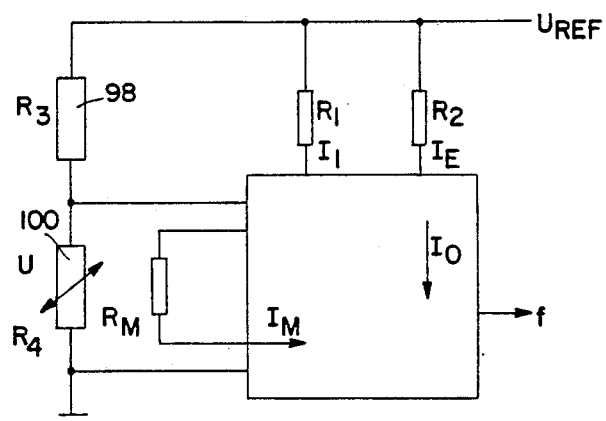
FIG. 4 shows the wiring of the converter circuit for the case where the analog input quantity to be converted is an electrical resistance.
Figure 5:
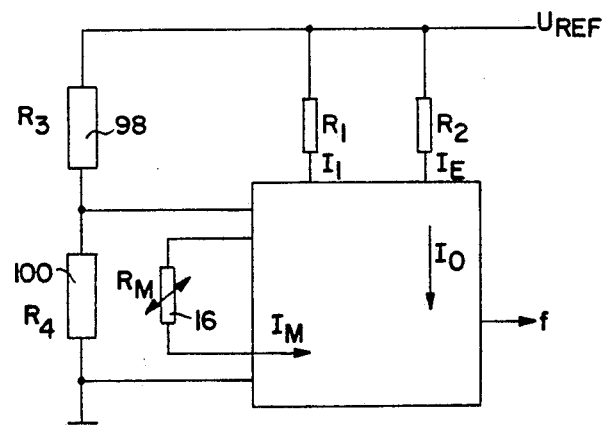
FIG. 5 shows another type of wiring of the converter circuit for the case, where the analog input quantity to be converted is an electrical resistance.

FIG. 4 shows a wiring of the integrated circuit component 96 such that a variable electrical resistance represents the measured quantity. To this end, a voltage divider is formed consisting of a fixed resistor 98 and the variable resistor 100 the resistance of which is to be digitized. This voltage divider is connected across the reference voltage. A voltage drops across the variable resistor. This voltage can be treated as measuring voltage in the described manner. If $R_3$ designates the resistance of the resistor 98 and $R_4$ designates the resistance of the resistor 100, the following relation exists:

$$R_4=R_M*R_3(F_m-F_0)/(R_2+(F_E-F_0)-R_M+(F_M-F_0)).$$

Another possibility is shown in FIG. 4. There the resistors of the voltage divider are fixed resistors. The resistance to be measured and to be digitized is the resistance of the "measuring resistor" 16. For this case, the following relation exists:

$$R_M=(R_2*R_4/(R_3+R_4))*((F_E-F_0)/(F_M-F_0)).$$

The resistance measurements are independent of the reference voltage $U_{REF}$.

I claim:

1. An integrated circuit analog-to-frequency converter component, comprising:
   an input for an analog input signal;
   means for generating known, analog balancing signals;
   means for converting said analog input signals and said analog balancing signals into proportional load-independent currents;
   a current controlled oscillator;
   electronic switching means for applying, in a predetermined sequence, said load-independent currents to said current controlled oscillator to provide a sequence of frequencies to be supplied to a processor for computing therefrom a digital value of said analog input signal; and,
   each of said frequencies representing one of said analog input and balancing signals.

2. A circuit arrangement for the analog signal-to-frequency conversion having an input for an analog input signal and converter means for converting analog signals into frequencies using an analog-to-frequency converter means and a processor, wherein:
   the circuit arrangement comprises means for generating known, analog balancing signals;
   and further comprising:
   means for converting said analog input signals and said analog balancing signals into proportional load-independent currents;
   said processor being arranged to compute a digital value of the analog input signal from two digital values which are obtained from the frequencies generated by converting said balancing signals and from the digital value which is generated by converting said analog input signal;
   said means for converting and said means for generating said balancing signals being integrated to form an integrated circuit;
   electronic switching means for applying said load-independent currents in pre-determined sequence to a summing point;
   a reference voltage generating an upper balancing current and a lower balancing current;
   said reference voltage also generating a reference current; and
   said processor being capable of controlling the circuit arrangement to apply to said summing point at different times a current corresponding: to the analog signal to be measured and said reference current; or said upper balancing current and said reference current; or said lower balancing current and said reference current.

3. A circuit arrangement as claimed in claim 2, characterized in that said means for converting said analog input signal into a load-independent current comprise:
   (a) a measuring resistor (16), one end of which is maintained at the potential of an input terminal (10) of said input for said input signal (U),
   (b) an operational amplifier (26), one input terminal (28) of which is connected with the other end of said measuring resistor (16) and another input terminal of which is connected to the second input terminal (12) of said input for said input signal (U), and
   (c) a transistor (32), the base of which is connected to a base point (62) and the collector of which is arranged to be connected to said other end of said measuring resistor (16) through said electronic switching means (58),
   (d) the output of said operational amplifier (26) being connected to said base point (62) through said electronic switching means (58).

4. A circuit arrangement as claimed in claim 3, characterized in that
   (a) said first input terminal (10) of said input for said input signal (U) is connected to one input terminal of a second operational amplifier (20), and
   (b) a second input terminal (22) of said second operational amplifier (20) and the output of this second operational amplifier (20) are connected to said one end of said measuring resistor.

5. A circuit arrangement as claimed in claim 4, characterized in that
   (a) said means for converting said balancing signals into load-independent currents comprise a third and a fourth operational amplifier (48 and 54, respectively), which are arranged to be energized under the control of said processor,
   (b) one input terminal of each of these operational amplifiers (48,50) is connected to earth,
   (c) the other input terminal of said third operational amplifier (48) is connected to said reference voltage through a fixed resistor (44) and is connected to the collector of said transistor (32) through a diode (50) and through said electronic switching means (58), and
   (d) the output of said third operational amplifier (48) is connected to said base point (62) through said electronic switching means (58),
   (e) the other input terminal of said fourth operational amplifier (54) is connected to the collector of said transistor (32) through said electronic switching means (58), and
   (f) the output of said fourth operational amplifier is connected to said base point (62) through said electronic switching means (58).

6. A circuit arrangement as claimed in claim 5, characterized in that the collector of said transistor (32) is connected to said reference voltage through a fixed second resistor (40).

7. A circuit arrangement as claimed in claim 6, characterized in that said base point (62) is connected with bases of transistors (64), which control a current of the current controlled oscillator.

* * * * *